United States Patent
Grady et al.

(10) Patent No.: US 8,689,066 B2
(45) Date of Patent: Apr. 1, 2014

(54) INTEGRATED CIRCUIT TEST OPTIMIZATION USING ADAPTIVE TEST PATTERN SAMPLING ALGORITHM

(75) Inventors: Matthew S. Grady, Burlington, VT (US); Mark C. Johnson, South Burlington, VT (US); Bradley D. Pepper, Essex Junction, VT (US); Dean G. Percy, Stowe, VT (US); Joseph C. Pranys, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 289 days.

(21) Appl. No.: 13/172,179

(22) Filed: Jun. 29, 2011

(65) Prior Publication Data

US 2013/0007546 A1    Jan. 3, 2013

(51) Int. Cl.
*G01R 31/28* (2006.01)
(52) U.S. Cl.
USPC ........................................ 714/728; 714/745
(58) Field of Classification Search
USPC .................................. 714/726, 33, 745, 728
See application file for complete search history.

(56) References Cited

U.S. PATENT DOCUMENTS

| | | | |
|---|---|---|---|
| 6,367,041 B1 | 4/2002 | Statovici et al. | |
| 6,377,901 B1 | 4/2002 | List et al. | |
| 6,473,871 B1 * | 10/2002 | Coyle et al. | 714/715 |
| 6,603,691 B2 | 8/2003 | Yoo et al. | |
| 6,708,306 B2 * | 3/2004 | Bartenstein et al. | 714/741 |
| 6,907,378 B2 | 6/2005 | Stirrat et al. | |
| 7,139,676 B2 | 11/2006 | Barford | |
| 7,284,167 B2 | 10/2007 | Lee et al. | |
| 7,363,557 B2 | 4/2008 | Evans | |
| 7,421,621 B1 * | 9/2008 | Zambrana | 714/38.14 |
| 7,474,979 B1 | 1/2009 | Stevens et al. | |
| 2005/0102566 A1 * | 5/2005 | Manley et al. | 714/25 |
| 2008/0172576 A1 * | 7/2008 | Kusko et al. | 714/33 |
| 2008/0234967 A1 | 9/2008 | Vandewiele et al. | |
| 2008/0263423 A1 | 10/2008 | Ward | |
| 2009/0018793 A1 | 1/2009 | Sakarovitch et al. | |
| 2010/0088054 A1 | 4/2010 | Miguelanez et al. | |
| 2010/0088560 A1 * | 4/2010 | Chakravarthy et al. | 714/724 |

OTHER PUBLICATIONS

Bahukudumbi, S.; Chakrabarty, K, "Power Management Using Test-Pattern Ordering for Wafer-Level Test During Burn-In," Very Large Scale Integration (VLSI) Systems, IEEE Transactions on , vol. 17, No. 12, pp. 1730,1741, Dec. 2009.*

(Continued)

*Primary Examiner* — Cynthia Britt
(74) *Attorney, Agent, or Firm* — Cantor Colburn LLP; Michael LeStrange

(57) ABSTRACT

A method of implementing integrated circuit device testing includes performing baseline testing of a first group of chips using a full set of test patterns, and for chip identified as failing, determining, a score for each test pattern in the full set. The score is indicative of an ability of the test pattern to uniquely identify a failing chip with respect to other test patterns. Following the baseline testing, streamlined testing on a second group of chips is performed, using a reduced set of the test patterns having highest average scores as determined by the baseline testing. Following the streamlined testing, full testing on a third group of chips is performed using the full set of test patterns, and updating the average score for each pattern. Further testing alternates between the streamlined testing and the full testing for additional groups of chips.

20 Claims, 4 Drawing Sheets

(56) References Cited

OTHER PUBLICATIONS

Lima, M.F.; Zarpelão, B.B.; Sampaio, L.D.H.; Rodrigues, J. J P C; Abrao, T.; Proença, M.L., "Anomaly detection using baseline and K-means clustering," Software, Telecommunications and Computer Networks (SoftCOM), 2010 International Conference on , vol., no., pp. 305,309, Sep. 23-25, 2010.*

Sounil Biswas and R.D. Blanton, "Test Compaction for Mixed-Signal Circuits Using Pass-Fail Test Data," 26th IEEE VLSI Test Symposium, IEEE Computer Society, p. 299- 308, 2008.

Ender Yilmaz & Sule Ozev, "Adaptive Test Elimination for Analog/RF Circuits," DAC'09, California, pp. 720-725, 2009.

* cited by examiner

| Time | Event | Patterns Used |
|---|---|---|
| $t_0$ | Initial Baseline Testing | A, B, C, D, E, F, G, H, I, J, K, L, M, N, O, P, Q, R, S, T |
| $t_1$ | Streamlined Testing | K, A, T, H, C, J, E, L, D, S |
| $t_2$ | Full Testing | K, A, T, H, C, J, E, L, D, S, B, Q, N, F, P, O, M, I, G, R |
| $t_3$ | Streamlined Testing | K, T, A, H, D, J, B, L, M, N |
| $t_4$ | Full Testing | K, T, A, H, D, J, B, L, M, N, E, Q, S, O, P, F, C, R, G, I |
| $t_5$ | Streamlined Testing | T, A, K, H, D, B, J, N, Q, P |

INTEGRATED CIRCUIT TEST OPTIMIZATION USING ADAPTIVE TEST PATTERN SAMPLING ALGORITHM

BACKGROUND

The present invention relates generally to semiconductor device manufacturing and, more particularly, to integrated circuit test optimization using an adaptive test pattern sampling algorithm.

Semiconductor devices are typically fabricated in large lots on semiconductor wafers. The fabrication process includes various steps such as, for example, deposition, lithography, etching, sputtering, and other techniques known to those skilled in the art. As with any other manufacturing process, defects inevitably arise during semiconductor manufacturing. These defects must be detected by the manufacturer before completed integrated circuit devices are delivered to customers.

Device testing in a manufacturing environment can be a complex and expensive process. Due to the increasing complexity of integrated circuit devices, the devices can suffer from a wide range of faults, such as shorts or opens in the semiconductor and wiring layers, stuck-at faults, and so on. To facilitate the detection of each of these faults, each device is typically subjected to a large number of different test patterns, as a single test pattern may typically only cover certain types of faults. On the other hand, each test pattern that is run adds to the cost of the overall testing process of the devices.

SUMMARY

In one aspect, a method of implementing integrated circuit device testing using adaptive test pattern selection includes performing an initial baseline testing of a first group of chips to be tested using a full set of test patterns; for each of the first group of chips identified as failing at least one of the full set of test patterns, determining, by a computing device, a score for each test pattern in the full set, the score indicative of an ability of the test pattern to uniquely identify a failing chip with respect to other test patterns, and keeping a running average of the score for each test pattern as subsequent failed chips are identified; following the initial baseline testing, performing streamlined testing on a second group of chips for a first duration, the streamlined testing comprising using a reduced set of the test patterns, the reduced set comprising test patterns having highest scores as determined by the initial baseline testing; following the streamlined testing, performing full testing on a third group of chips for a second duration, the full testing comprising using the full set of the test patterns and, during the full testing, resuming determining a score for each test pattern in the full set for each failing device in the third group of chips and updating the running average of the score for each test pattern; and alternating between the streamlined testing and the full testing for additional groups of chips.

In another aspect, a computer program product includes a non-transitory, tangible computer readable medium having computer readable instructions stored thereon that, when executed by a computer, implement a method of implementing integrated circuit device testing using adaptive test pattern selection. The method includes performing an initial baseline testing of a first group of chips to be tested using a full set of test patterns; for each of the first group of chips identified as failing at least one of the full set of test patterns, determining a score for each test pattern in the full set, the score indicative of an ability of the test pattern to uniquely identify a failing chip with respect to other test patterns, and keeping a running average of the score for each test pattern as subsequent failed chips are identified; following the initial baseline testing, performing streamlined testing on a second group of chips for a first duration, the streamlined testing comprising using a reduced set of the test patterns, the reduced set comprising test patterns having highest scores as determined by the initial baseline testing; following the streamlined testing, performing full testing on a third group of chips for a second duration, the full testing comprising using the full set of the test patterns and, during the full testing, resuming determining a score for each test pattern in the full set for each failing device in the third group of chips and updating the running average of the score for each test pattern; and alternating between the streamlined testing and the full testing for additional groups of chips.

In still another aspect, a system for implementing integrated circuit device testing using adaptive test pattern selection includes a computing network having a processing device in communication with one or more computer memory storage devices. The processing device is configured to perform an initial baseline testing of a first group of chips to be tested using a full set of test patterns; for each of the first group of chips identified as failing at least one of the full set of test patterns, determine a score for each test pattern in the full set, the score indicative of an ability of the test pattern to uniquely identify a failing chip with respect to other test patterns, and keeping a running average of the score for each test pattern as subsequent failed chips are identified; following the initial baseline testing, perform streamlined testing on a second group of chips for a first duration, the streamlined testing comprising using a reduced set of the test patterns, the reduced set comprising test patterns having highest scores as determined by the initial baseline testing; following the streamlined testing, perform full testing on a third group of chips for a second duration, the full testing comprising using the full set of the test patterns and, during the full testing, resume determining a score for each test pattern in the full set for each failing device in the third group of chips and updating the running average of the score for each test pattern; and alternate between the streamlined testing and the full testing for additional groups of chips.

BRIEF DESCRIPTION OF THE SEVERAL VIEWS OF THE DRAWINGS

Referring to the exemplary drawings wherein like elements are numbered alike in the several Figures:

FIG. 3 is a table illustrating hypothetical test results using the method of FIG. 2.

DETAILED DESCRIPTION

Figure 1:
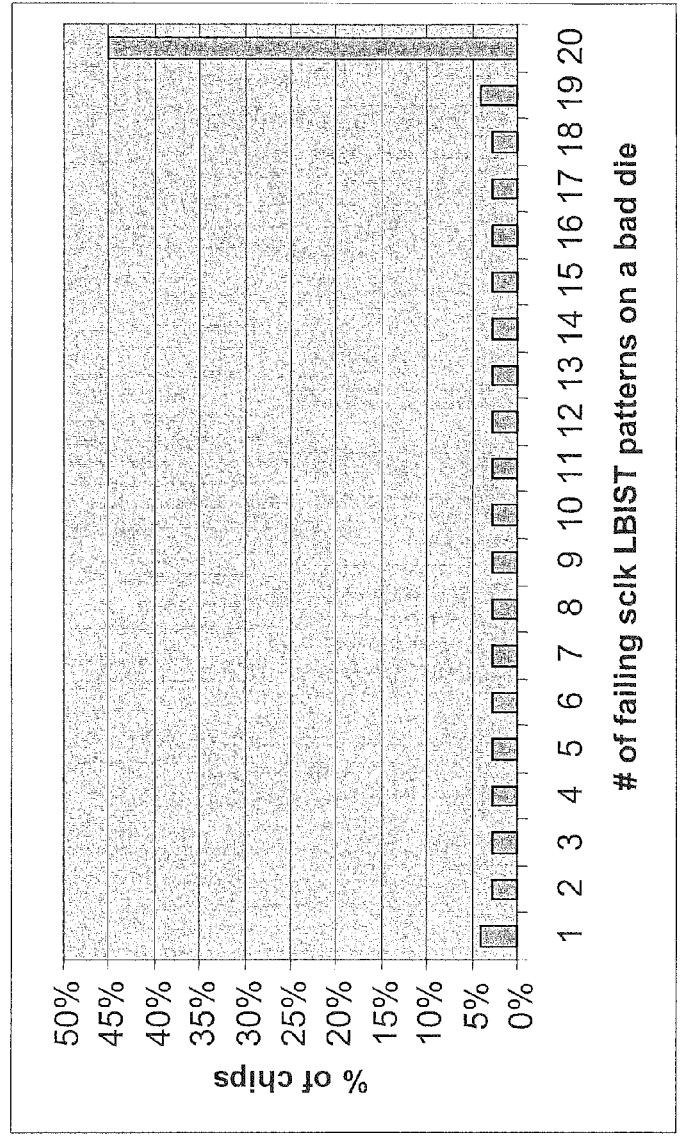
FIG. 1 is a histogram illustrating results of a test pattern fail distribution for logic built-in self test (LBIST) patterns for one physical section of a device.

As indicated above, integrated circuit devices are subjected to large numbers (e.g., hundreds or even thousands) of test patterns in order to ensure defect detection. This is the case, even though it is generally recognized in the semiconductor industry that most defective devices can be caused to fail with many fewer tests than are typically run in a testing process. It is also well recognized that most of the time used to test digital integrated circuits is made up of the running of functional tests. However, the main problem in this regard is that it is not known ahead of time which ones of the available functional tests are going to catch a defective device. Therefore, IC manufacturers typically run all the tests available, and therefore much test time is wasted. Efforts may be made to look at historical pass/fail information with respect to functional test fails, followed by reducing the pattern list, but such a process is iterative and backward looking.

Pattern ranking and reordering to reduce test time is also another approach that may be taken within the industry. However, reordering is typically done to reduce the time it takes to detect a failing chip, and the analysis to determine the new order is done after testing a significant amount of product and long term historical data. Still other solutions are backwards looking and static. Functional test fail data are collected and analyzed, and from that analysis, a test program is modified to run the most effective subset of patterns. If for some reason a "most effective test list" changes, the ability to react to this situation is slow and requires new analysis. When a device is faulty, typically many of the several applied test patterns fail. It is easy to see in hindsight how one could have run fewer patterns and still culled out the failing devices, but the challenge is to adaptively choose the best subset of patterns to run while material is being tested, with no other information provided.

Accordingly, disclosed herein is a method to collect data and rank functional test patterns by their ability to fail faulty devices uniquely. An adaptive test algorithm then uses this information to run the most effective sample of patterns on most devices, while still continuing to collect pattern fail statistics on some other devices. As a result, the time for testing good and bad devices is reduced, and with a minimal number of "escapes" of bad devices.

As described in further detail below, the exemplary embodiments described herein reorder the test patterns on a test session by test session basis, without considering the historical data from other lets test sessions, and removes patterns with low probability of uniquely catching a defect from the end of the new order, thereby reducing the test time of a good device without significantly impacting quality. In addition, because the reordering does not consider historical data from other test sessions, it is less likely to remove patterns that would catch process specific defects unique to the present material under test.

In a given list of test patterns, there will be some frequency of fail for each pattern applied to faulty hardware. By way of illustration, FIG. 1 is a histogram 100 illustrating actual results of a test pattern fail distribution for logic built-in self test (LBIST) patterns for one physical section of a device. The x-axis represents a total number out of a possible 20 different test patterns that cause a given bad chip to fail the test. The y-axis represents what percentage of the total number of bad chips had that specific number of test pattern fails. As can be seen from the data, nearly 50% of the bad devices fail either 19 or 20 out of the 20 total patterns (with about 45% of the bad devices failing all 20 patterns), while smaller percentages of the bad devices fail 18, 17, etc., out of 20 patterns. This data is typical of most functional tests, and illustrates how most faulty devices may be identified by running fewer than the total number of test patterns.

However, a difficulty arises with certain faulty devices that only fail a relatively small number of the total test patterns. If, for example, only 10 out of the 20 test patterns are randomly run (i.e., 50% test coverage), then any device that would fail 11 or more of the total patterns will always be guaranteed to fail with only 10 randomly selected patterns and therefore the faulty device may be identified without needing to run all 20 test patterns. On the other hand, devices that fail only 10 or fewer of the 20 total patterns will have some mathematical probability of escape, as illustrated in Table 1 below:

TABLE 1

| # of Failing Patterns (out of 20) | Probability of Escape Using 50% Test Coverage |
| --- | --- |
| 11-20 | 0 |
| 10 | 0.00000541 |
| 9 | 0.00005954 |
| 8 | 0.00035723 |
| 7 | 0.00154799 |
| 6 | 0.00541796 |
| 5 | 0.01625387 |
| 4 | 0.04334365 |
| 3 | 0.10526316 |
| 2 | 0.23684211 |
| 1 | 0.50000000 |

In the worst case for this example, a faulty device that fails only 1 of the 20 total test patterns will have a 50% probability of escape if only 10 out of 20 patterns are randomly selected, while a device that fails 2 of the 20 patterns will have about a 24% chance of escape, and so forth. While as a practical matter there are not many integrated circuit devices in the world that fail only a small number of test patterns (such as between 1 to 3 for example), an intelligent scheme for pattern selection can reduce the probability of escape even further.

More specifically, the present embodiments introduce the concept of a "score" for a test pattern with respect to a failing device, wherein:

$$\text{Score}_{fail} = \text{total patterns} + 1 - (\text{\# of failing patterns}) \quad \text{(Eq. 1)}$$

$$\text{Score}_{pass} = 0 \quad \text{(Eq. 2)}$$

For example, in a test that runs 10 patterns, if a given device fails and there is only one failing test pattern for the failing device, then the score for that pattern on that device is 10. All other patterns that did not fail receive a score of 0 on that device. On the other hand, where a device fails and all 10 of the test patterns are failing patterns, then each test pattern receives a score of 1. Thus, it will be seen that the higher the score for a test pattern for a given failed device, the more "unique" that test pattern was in determining a faulty device. As a group of test patterns is repeatedly applied to a lot of semiconductor devices, a running average of the uniqueness score for each of the test patterns may be computed as bad chips are discovered during the testing process. Over time, the average score for the patterns may change, and during the course of testing those patterns with the highest average scores may be single out and applied to subsequent chips in a subset of total patterns as they are more likely to better at uniquely identifying bad devices than those with lower average scores.

Figure 2:
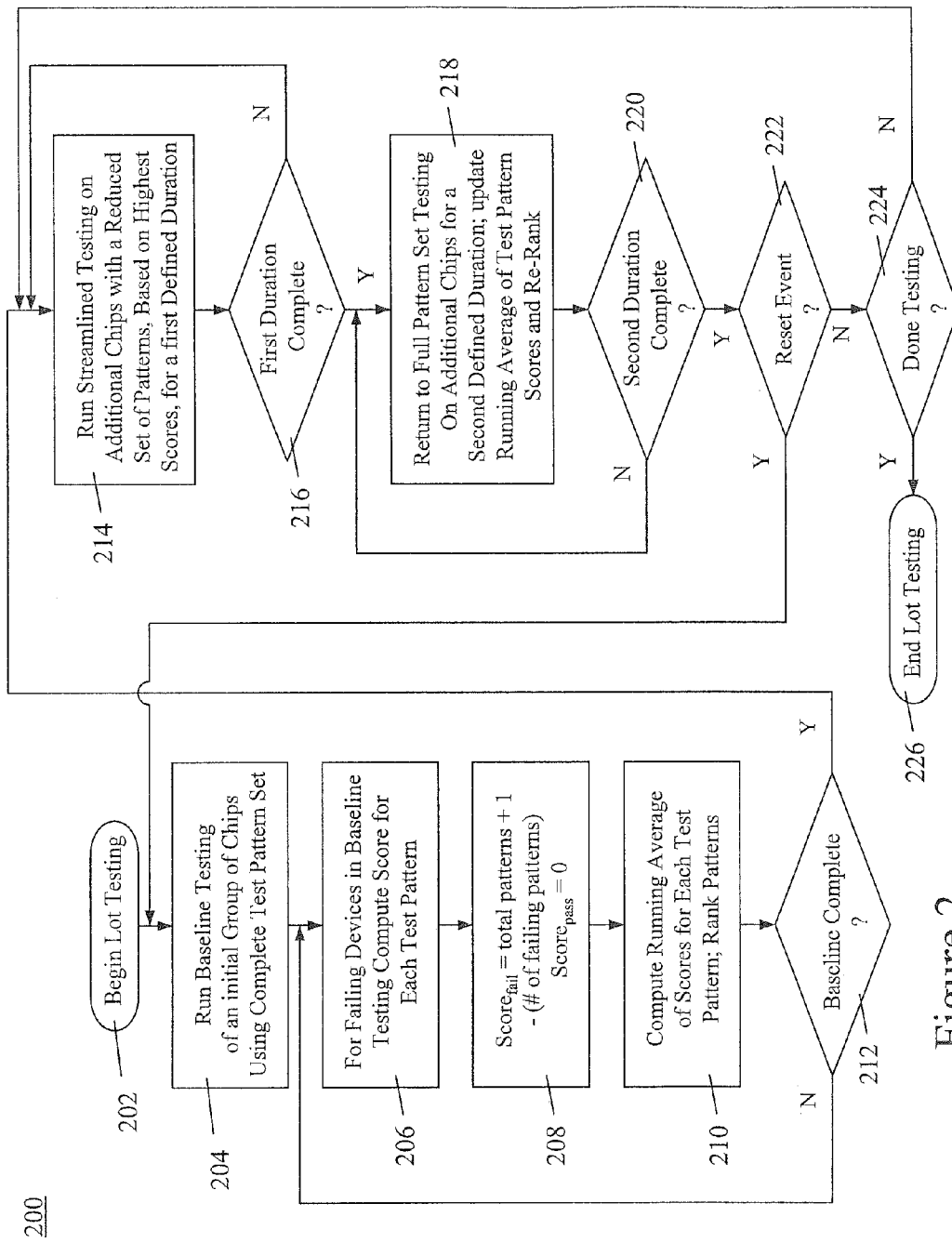
FIG. 2 is a flow diagram illustrating a method for implementing integrated circuit device testing using adaptive test pattern selection, in accordance with an embodiment of the invention.

Referring now to FIG. 2, there is shown a flow diagram illustrating a method 200 for implementing integrated circuit device testing using adaptive test pattern selection, in accordance with an embodiment of the invention. In block 202, the method begins with testing of a lot of wafers upon which individual semiconductor chips are manufactured. As indicated in block 204, an initial group of chips is first selected for baseline testing, in which the complete test pattern set is used so that an initial ranking of test pattern scores may be generated.

When an individual chip is tested, it will either fail or not, meaning that if a chip fails one or more of the applied test patterns it is considered bad. Those chips that pass all of the applied test patterns are considered good. For each failing chip, then, an individual test score will be computed for all of the applied test patterns in the set for the baseline testing mode, as shown in block 206. In block 208, the score for each test pattern, in view of a failed chip, is computed in accordance with equations 1 and 2 described above.

By way of a first example, it is assumed that there are 20 total patterns (A through T) in a test set. During baseline testing, a first failed chip is discovered with the following test results, and calculated scores:

TABLE 2

| Test | Fail? | Score |
|---|---|---|
| A | Y | 3 |
| B | Y | 3 |
| C | Y | 3 |
| D | Y | 3 |
| E | Y | 3 |
| F | Y | 3 |
| G | N | 0 |
| H | Y | 3 |
| I | Y | 3 |
| J | Y | 3 |
| K | Y | 3 |
| L | Y | 3 |
| M | Y | 3 |
| N | Y | 3 |
| O | Y | 3 |
| P | Y | 3 |
| Q | Y | 3 |
| R | N | 0 |
| S | Y | 3 |
| T | Y | 3 |

As shown from the table above, all patterns except for test patterns G and R failed for the failing device, thus the 18 failing patterns receive a uniqueness score of 3, while patterns G and R receive a score of 0. As additional failures are discovered during the baseline testing, a running average of the scores for each pattern may also be computed and used to rank the patterns, as reflected in block 210 of FIG. 2. Continuing the above example, it will be assumed that for the next identified failed chip, all 20 patterns failed. This results in each test pattern receiving a 1 score for that chip. Factoring these updated results into the data from Table 2 would yield the following average ranking for the patterns after 2 chip fails:

TABLE 3

| Test | Average Score |
|---|---|
| A | 2 |
| B | 2 |
| C | 2 |
| D | 2 |
| E | 2 |
| F | 2 |
| H | 2 |
| I | 2 |
| J | 2 |
| K | 2 |
| L | 2 |
| M | 2 |
| N | 2 |
| O | 2 |
| P | 2 |
| Q | 2 |
| S | 2 |

TABLE 3-continued

| Test | Average Score |
|---|---|
| T | 2 |
| G | 0.5 |
| R | 0.5 |

As can be seen from Table 3 above, test patterns G and R have the lowest average ranking after two failed chips. In the case that the next failed chip in the baseline testing sequence only had 1 of 20 failing patterns, for example K, then the score for pattern K for that chip would be 20, while the score for the remaining 18 patterns would be 0. From this third failed chip, a new ranking would emerge as follows:

TABLE 4

| Test | Average Score |
|---|---|
| K | 8 |
| A | 1.33 |
| B | 1.33 |
| C | 1.33 |
| D | 1.33 |
| E | 1.33 |
| F | 1.33 |
| H | 1.33 |
| I | 1.33 |
| J | 1.33 |
| L | 1.33 |
| M | 1.33 |
| N | 1.33 |
| O | 1.33 |
| P | 1.33 |
| Q | 1.33 |
| S | 1.33 |
| T | 1.33 |
| G | 0.33 |
| R | 0.33 |

To this point, after the identification of 3 failed chips, test pattern K emerges as an early "high value" test pattern which would be desired to use for all testing, whereas test patterns G and R emerge as early "low value" test patterns that could be skipped in the interest of testing efficiency. As should be appreciated, actual test scores for an actual number of test patterns would likely converge to a smaller range of values over time during baseline testing.

Referring once again to FIG. 2, decision block 212 reflects looping back to block 206 while the baseline testing is still in progress. As will be appreciated, the baseline testing (i.e., testing all patterns) should be performed for a sufficient number of chips so as to obtain a statistically meaningful average score for the tests for ranking purposes, but not for so many chips as to increase the overall testing time. Otherwise, the purpose of test pattern reduction is arguably defeated.

Once the initial baseline testing is complete, the process proceeds to block 214, where streamlined testing on additional chips is run using a selected subset of the total patterns (the selection based on the rankings obtained in the baseline testing) for a first defined duration. By "duration" it is contemplated that the streamlined testing may be governed by a specific time period or by a specific number of wafers or chips tested. During the streamlined testing using a reduced set of the total patterns, no pattern scoring or updated averages are calculated. Rather, this represents a time period in which the benefits of the pattern scoring are utilized, in that only the most effective patterns to date are used for reduced testing time while decreasing the chances of bad chip escapes.

In keeping with the above test pattern example, it will be assumed that the selected number of the reduced set of patterns to be used in streamlined testing is 10 (i.e., 50% of the total. In this case, of the total set of patterns A through T, the highest ranked 10 patterns after baseline testing (and therefore those used) beginning at block 214 may be, for example: K, A, T, H, C, J, E, L, D, S.

So long as decision block 216 determines that the defined first duration is not yet completed, the process loops back to block 214 where streamlined testing continues using the reduced set of patterns. However, once this first duration is complete, the process proceeds to block 218 for a return to full pattern set testing for a second defined duration, including updated scoring and ranking of the test patterns as was done for the baseline testing. In this manner, the rankings of the most effective test patterns may change over the course of additional lot testing. Thus, in the event the originally selected subset for streamlined testing after baseline testing is no longer optimal, the updated full pattern testing in block 218 will determine a new ranking for further streamlined testing. Decision block 220 tracks the second duration of updated full pattern testing/ranking, and loops back to block 218 until the second duration is complete.

A cadence may be established and parameterized with respect to the first and second durations. After initial baseline testing, the streamlined testing using a reduced pattern set may be performed at a duty cycle of, for example about 80%, after which the testing process reverts to a full pattern set with updated pattern scoring/ranking for about 20% of the time. As should be appreciated, the first and second durations may be selected so as to strike an appropriate balance between testing with the reduced, optimized test pattern set and full testing so as to dynamically and adaptively update the scoring and ensure the optimization of the pattern ranking. Moreover, the duty cycle may be defined in terms of number of chips. For example, streamlined testing may be used for about 80% of chips to be tested following baseline testing, and full testing may be used for about 20% of chips to be tested following baseline testing.

Optionally, during the overall testing process, the method 200 may include detection of a "reset" criteria where upon determination some type of defined event, the initial baselining starts over, with the current pattern ranking erased. A reset event may include, for example, reaching a defined count of failing chips, detecting a change in the observed yield, reaching a beginning of a new lot of wafers, etc. This option is reflected by decision block 222 in FIG. 2 where, if a reset event is detected, the process reverts back to block 204 for new baseline testing as described above. While this determination is shown after the full pattern testing portion of the duty cycle in FIG. 2, such a determination of a reset criteria may be inserted at any point following the initial baselining.

So long as the testing continues as determined in decision block 224, following completion of the second duration (block 220), and assuming no reset event is detected, the process loops back to block 214 for the streamlined portion of the duty cycle. Finally, once testing is completed, the process ends at block 226.

To illustrate the usefulness of briefly returning to full testing and updated patterning ranking for a second duration after a first duration of streamlined testing, FIG. 3 is a table illustrating hypothetical test results using the above described example of baseline testing, streamlined testing, and full pattern testing of the 20 test patterns A through T. Time $t_0$ reflects the start of the initial baseline testing of chips using all 20 patterns A through T. After the completion of the initial baseline testing, in the above example, the top scoring 10 test patterns were ranked in the order of: K, A, T, H, C, J, E, L, D, S. Thus, at the beginning of the first streamlined testing period at time $t_0$, those 10 patterns are used for streamlined testing.

At time $t_2$, the testing reverts back to all 20 patterns as reflected in FIG. 3. This may result in a reordering of the rankings as different chips are tested, which in turn could result in a different subset of 10 patterns being used for the next duration of streamlined testing. In the example depicted, it will be seen that at time $t_3$ where the next period of streamlined testing is implemented, tests C, E and S are no longer ranked in the top 10 in scoring and thus are removed from streamlined testing for the time being. Instead, they are replaced by tests B, M and N, whose scores increased during the full testing at time $t_2$. It is also noted, for example, as between the first and second instances of streamlined testing at times $t_1$ and $t_3$, tests A and T (while still in the top 10) have switch places in accordance with the updated rankings.

Over time, and as the process reverts between streamlined testing and full testing with updated pattern scoring and ranking, further changes are conceivable. For example, whereas test pattern K was initially ranked as the best for uniquely identifying failing devices, at time $t_5$, test pattern T has taken over the top ranking. In addition, test pattern M is once again removed from streamlined testing as it was no longer in the top ten as of $t_5$.

As will thus be appreciated, among the advantages of the above described algorithm include minimal complexity of the data structures and computation in keeping a running score average and sorting the pattern list based on the score. In addition, no past test information is needed since the algorithm adapts as testing of product progresses, and thus makes better decisions on pattern ranking based on the material being tested. Still further, the algorithm stands alone, in that no interaction with other test cells is needed.

Actual trials of the above described pattern sampling technique have been conducted on a standard microprocessor. Trials included a re-run of already sorted wafers with a sampling program, and split wafer lots where half the wafers were run process-of-record, and half with pattern sampling. In wafer split lot trials, the devices failing module test were analyzed to get an escape count. In all trials, LBIST patterns were sampled. The baseline sample was five failing devices, and the pattern sampling consisted of half the patterns on 80% of the devices.

In the re-run wafer trial, 10 wafers with 3690 chip starts were run with both the process of record (POR) program, and then again with the sampling program. There were 1383 "goods" and 60 LBIST fails from the POR test; a re-run with the sampling program yielded exactly the same results, with zero escapes. By way of further comparison, for a wafer split lot trial using 2513 starts for the POR test, the resulting module yield was 98.7%. Using 2634 starts for the sampling test, the resulting module yield was 98.8%. Of the modules tested by running the sampling wafer program, 25 of those were analyzed as potential candidates for being actual test escapes. Of the 25 devices analyzed, it was determined that only one module fail was due to wafer pattern sampling. The failing device was determined to have failed only one LBIST pattern, and traceback to wafer test showed that this one pattern was not run on the device.

In summary, of all trials conducted, there were only 2 escapes out of 6977 total candidates, or 0.0287%. In both cases, the escapes resulted from devices that failed just a single pattern. The cost of building a bad module for the studied product is about $5, thus two escapes results in a total cost $10. On the other hand, the sampling of LBIST saves half the LBIST test time on 80% of the material. For the studied product, this time saving amounts to about 0.5 seconds per device. At a cost of $0.05/second, the cost of test savings on 6977 devices is about $170. Therefore, the present sampling technique demonstrates a clear cost benefit (>15×) for this application.

Figure 4:
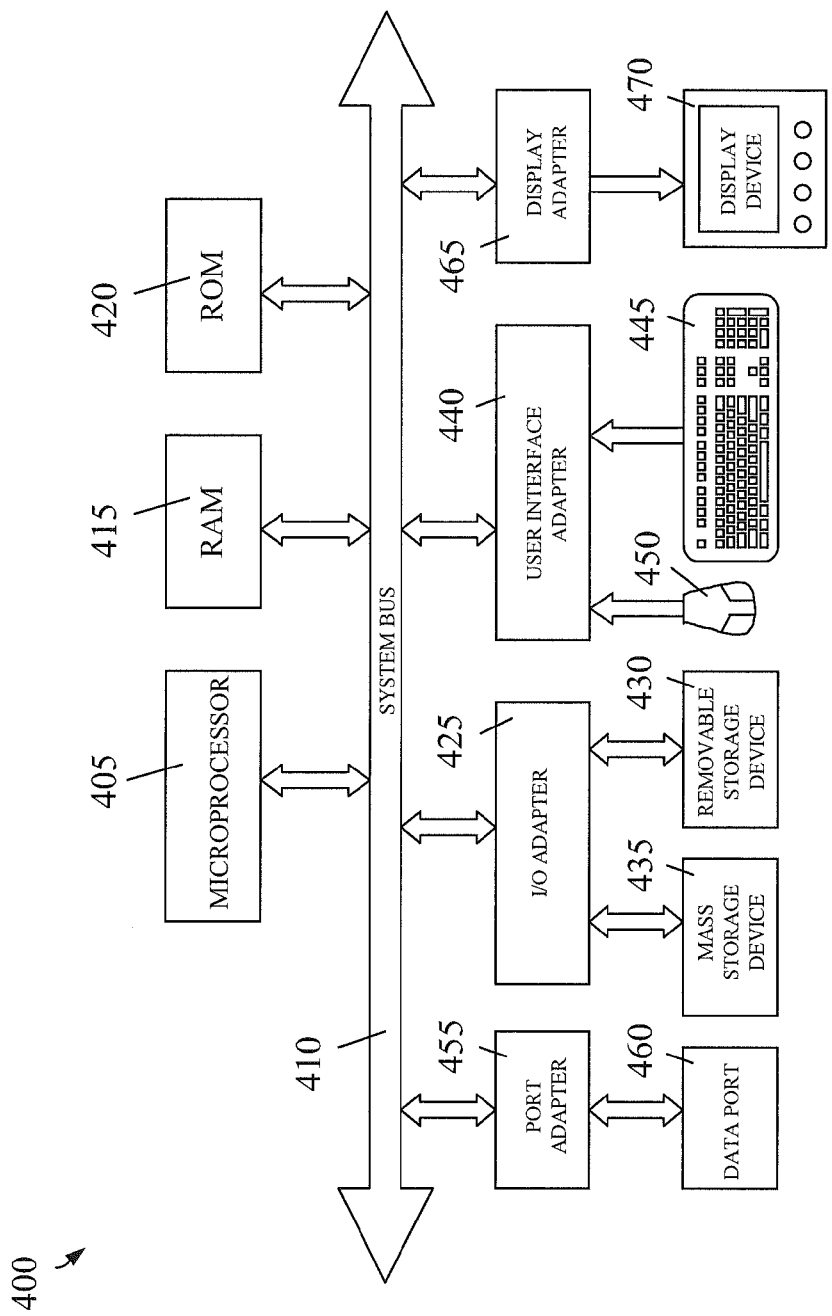
FIG. 4 is a schematic block diagram of a general-purpose computing system suitable for practicing embodiments of the present invention.

Generally, the method embodiments for implementing integrated circuit device testing using adaptive test pattern selection may be practiced with a general-purpose computer and the method may be coded as a set of instructions on removable or hard media for use by the general-purpose computer. FIG. 4 is a schematic block diagram of a general-purpose computing system suitable for practicing embodiments of the present invention. In FIG. 4, computing system 400 has at least one microprocessor or central processing unit (CPU) 405. CPU 405 is interconnected via a system bus 410 to a random access memory (RAM) 415, a read-only memory (ROM) 420, an input/output (I/O) adapter 425 for a connecting a removable data and/or program storage device 430 and a mass data and/or program storage device 435, a user interface adapter 440 for connecting a keyboard 445 and a mouse 450, a port adapter 455 for connecting a data port 460 and a display adapter 465 for connecting a display device 470.

ROM 420 contains the basic operating system for computing system 400. The operating system may alternatively reside in RAM 415 or elsewhere as is known in the art. Examples of removable data and/or program storage device 430 include magnetic media such as floppy drives and tape drives and optical media such as CD ROM drives. Examples of mass data and/or program storage device 435 include hard disk drives and non-volatile memory such as flash memory. In addition to keyboard 445 and mouse 450, other user input devices such as trackballs, writing tablets, pressure pads, microphones, light pens and position-sensing screen displays may be connected to user interface 440. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 430, fed through data port 460 or typed in using keyboard 445.

In view of the above, the present method embodiments may therefore take the form of computer or controller implemented processes and apparatuses for practicing those processes. The disclosure can also be embodied in the form of computer program code containing instructions embodied in tangible media, such as floppy diskettes, CD-ROMs, hard drives, or any other computer-readable storage medium, wherein, when the computer program code is loaded into and executed by a computer or controller, the computer becomes an apparatus for practicing the invention. The disclosure may also be embodied in the form of computer program code or signal, for example, whether stored in a storage medium, loaded into and/or executed by a computer or controller, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits. A technical effect of the executable instructions is to implement the exemplary method described above and illustrated in FIG. 2.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of implementing integrated circuit device testing using adaptive test pattern selection, the method comprising:
performing an initial baseline testing of a first group of chips to be tested using a full set of test patterns;
for each of the first group of chips identified as failing at least one of the full set of test patterns, determining, by a computing device, a score for each test pattern in the full set, the score indicative of an ability of the test pattern to uniquely identify a failing chip with respect to other test patterns, and keeping a running average of the score for each test pattern as subsequent failed chips are identified;
following the initial baseline testing, performing streamlined testing on a second group of chips for a first duration, the streamlined testing comprising using a reduced set of the test patterns, the reduced set comprising test patterns having highest scores as determined by the initial baseline testing;
following the streamlined testing, performing full testing on a third group of chips for a second duration, the full testing comprising using the full set of the test patterns and, during the full testing, resuming determining a score for each test pattern in the full set for each failing device in the third group of chips and updating the running average of the score for each test pattern; and
alternating between the streamlined testing and the full testing for additional groups of chips.

2. The method of claim 1, wherein the score for each test pattern is determined as follows:

Score$_{fail}$=total patterns+1−(# of failing patterns); and

Score pass=0;

wherein, for each failing chip identified during the initial baseline testing and the full testing, Score$_{fail}$ represents the score for each test pattern in the full set that was failed by the failing chip and Score$_{pass}$ represents the score for each test pattern in the full set that was not failed by the failing chip.

3. The method of claim 2, wherein the reduced set of the test patterns is about 50% of the full set of test patterns.

4. The method of claim 2, wherein the first duration is greater than the second duration.

5. The method of claim 4, wherein the first duration and the second duration are selected so as to establish a duty cycle of testing about 80% of chips under streamlined testing and about 20% of chips under full testing.

6. The method of claim 2, further comprising detecting a reset criteria based on a defined event that results in restarting the initial baseline testing by erasing a current test pattern ranking.

7. The method of claim 6, wherein the defined event comprises one or more of: reaching a defined count of failing chips, detecting a change in observed yield, and reaching a beginning of a new lot of wafers.

8. A computer program product comprising a non-transitory, tangible computer readable medium having computer readable instructions stored thereon that, when executed by a computer, implement a method of testing an integrated circuit device by using adaptive test pattern selection, the method comprising:

performing an initial baseline testing of a first group of chips to be tested using a full set of test patterns;

for each of the first group of chips identified as failing at least one of the full set of test patterns, determining a score for each test pattern in the full set, the score indicative of an ability of the test pattern to uniquely identify a failing chip with respect to other test patterns, and keeping a running average of the score for each test pattern as subsequent failed chips are identified;

following the initial baseline testing, performing streamlined testing on a second group of chips for a first duration, the streamlined testing comprising using a reduced set of the test patterns, the reduced set comprising test patterns having highest scores as determined by the initial baseline testing;

following the streamlined testing, performing full testing on a third group of chips for a second duration, the full testing comprising using the full set of the test patterns and, during the full testing, resuming determining a score for each test pattern in the full set for each failing device in the third group of chips and updating the running average of the score for each test pattern; and alternating between the streamlined testing and the full testing for additional groups of chips.

9. The computer program product of claim 8, wherein the score for each test pattern is determined as follows:

$$Score_{fail} = \text{total patterns} + 1 - (\text{\# of failing patterns}); \text{ and}$$

$$Score_{pass} = 0;$$

wherein, for each failing chip identified during the initial baseline testing and the full testing, $Score_{fail}$ represents the score for each test pattern in the full set that was failed by the failing chip and $Score_{pass}$ represents the score for each test pattern in the full set that was not failed by the failing chip.

10. The computer program product of claim 9, wherein the reduced set of the test patterns is about 50% of the full set of test patterns.

11. The computer program product of claim 9, wherein the first duration is greater than the second duration.

12. The computer program product of claim 11, wherein the first duration and the second duration are selected so as to establish a duty cycle of testing about 80% of chips under streamlined testing and about 20% of chips under full testing.

13. The computer program product of claim 9, wherein the method further comprises detecting a reset criteria based on a defined event that results in restarting the initial baseline testing by erasing a current test pattern ranking.

14. The computer program product of claim 13, wherein the defined event comprises one or more of: reaching a defined count of failing chips, detecting a change in observed yield, and reaching a beginning of a new lot of wafers.

15. A system for implementing integrated circuit device testing using adaptive test pattern selection, comprising:

a computing network including a processing device in communication with one or more computer memory storage devices; and the processing device configured to:

perform an initial baseline testing of a first group of chips to be tested using a full set of test patterns;

for each of the first group of chips identified as failing at least one of the full set of test patterns, determine a score for each test pattern in the full set, the score indicative of an ability of the test pattern to uniquely identify a failing chip with respect to other test patterns, and keeping a running average of the score for each test pattern as subsequent failed chips are identified;

following the initial baseline testing, perform streamlined testing on a second group of chips for a first duration, the streamlined testing comprising using a reduced set of the test patterns, the reduced set comprising test patterns having highest scores as determined by the initial baseline testing;

following the streamlined testing, perform full testing on a third group of chips for a second duration, the full testing comprising using the full set of the test patterns and, during the full testing, resume determining a score for each test pattern in the full set for each failing device in the third group of chips and updating the running average of the score for each test pattern; and alternate between the streamlined testing and the full testing for additional groups of chips.

16. The system of claim 15, wherein the score for each test pattern is determined as follows:

$$Score_{fail} = \text{total patterns} + 1 - (\text{\# of failing patterns}); \text{ and}$$

$$Score_{pass} = 0;$$

wherein, for each failing chip identified during the initial baseline testing and the full testing, $Score_{fail}$ represents the score for each test pattern in the full set that was failed by the failing chip and $Score_{pass}$ represents the score for each test pattern in the full set that was not failed by the failing chip.

17. The system of claim 16, wherein the reduced set of the test patterns is about 50% of the full set of test patterns.

18. The system of claim 16, wherein the first duration and the second duration are selected so as to establish a duty cycle of testing about 80% of chips under streamlined testing and about 20% of chips under full testing.

19. The system of claim 16, wherein the processing device is further configured to detect a reset criteria based on a defined event that results in restarting the initial baseline testing by erasing a current test pattern ranking.

20. The system of claim 19, wherein the defined event comprises one or more of: reaching a defined count of failing chips, detecting a change in observed yield, and reaching a beginning of a new lot of wafers.

* * * * *